US012588261B2

(12) United States Patent
Lionti et al.

(10) Patent No.: US 12,588,261 B2
(45) Date of Patent: Mar. 24, 2026

(54) SELECTIVE DEPOSITION ON METALS USING POROUS LOW-K MATERIALS

(71) Applicant: INTERNATIONAL BUSINESS MACHINES CORPORATION, Armonk, NY (US)

(72) Inventors: Krystelle Lionti, San Jose, CA (US); Rudy J. Wojtecki, San Jose, CA (US); Noel Arellano, Gilroy, CA (US); Son Nguyen, Schenectady, NY (US); Hosadurga Shobha, Niskayuna, NY (US); Balasubramanian Pranatharthiharan, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 784 days.

(21) Appl. No.: 17/524,884

(22) Filed: Nov. 12, 2021

(65) Prior Publication Data

US 2023/0154757 A1     May 18, 2023

(51) Int. Cl.
| | |
|---|---|
| *H10P 14/61* | (2026.01) |
| *H10D 64/01* | (2025.01) |
| *H10P 14/60* | (2026.01) |
| *H10P 14/692* | (2026.01) |
| *C23C 16/04* | (2006.01) |

(52) U.S. Cl.
CPC ... *H10D 64/01352* (2026.01); *H10P 14/6339* (2026.01); *H10P 14/69391* (2026.01); *C23C 16/04* (2013.01); *H10P 14/665* (2026.01)

(58) Field of Classification Search
None
See application file for complete search history.

(56) References Cited

U.S. PATENT DOCUMENTS

| | | | |
|---|---|---|---|
| 7,902,064 | B1 | 3/2011 | Chiang et al. |
| 8,178,439 | B2 | 5/2012 | Tohnoe et al. |
| 8,242,019 | B2 | 8/2012 | Ishizaka et al. |

(Continued)

FOREIGN PATENT DOCUMENTS

| | | |
|---|---|---|
| WO | 2020117725 A2 | 6/2020 |

OTHER PUBLICATIONS

Li et al., "Inherently Area-Selective Atomic Layer Deposition of Manganese Oxide through Electronegativity-Induced Adsorption", Molecules 2021, 26, 3056. https://doi.org/10.3390/molecules26103056, May 2021, pp. 1-11.

(Continued)

*Primary Examiner* — David P Turocy
(74) *Attorney, Agent, or Firm* — Tutunjian & Bitetto, P.C.; Robert Richard Aragona

(57) ABSTRACT

A method is presented for selective deposition on metals using porous low-k materials. The method includes forming alternating layers of a porous dielectric material and a first conductive material, forming a surface aligned monolayer (SAM) over the first conductive material, depositing hydroxamic acid (HA) material over the porous dielectric material, growing an oxide material over the first conductive material, removing the SAM, depositing a dielectric layer adjacent the oxide material, and replacing the oxide material with a second conductive material defining a bottom electrode.

18 Claims, 7 Drawing Sheets

(56) References Cited

U.S. PATENT DOCUMENTS

| | | | |
|---|---|---|---|
| 10,103,057 | B2 | 10/2018 | Abelson et al. |
| 10,777,411 | B1 | 9/2020 | Nguyen et al. |
| 2010/0248473 | A1 | 9/2010 | Ishizaka et al. |
| 2011/0244680 | A1 | 10/2011 | Tohnoe et al. |
| 2016/0148839 | A1 | 5/2016 | Abelson et al. |
| 2019/0017170 | A1 | 1/2019 | Sharma et al. |
| 2019/0391494 | A1* | 12/2019 | Wojtecki ................... G03F 7/26 |
| 2020/0090924 | A1 | 3/2020 | Wu et al. |
| 2020/0105515 | A1 | 4/2020 | Maes et al. |
| 2020/0122191 | A1 | 4/2020 | Haukka et al. |
| 2021/0313228 | A1* | 10/2021 | Nguyen ................ H01L 21/321 |

OTHER PUBLICATIONS

International Search Report from PCT/EP2022/078183 dated Feb. 22, 2023. (10 pages).

* cited by examiner

170

164 kerf via MRAM

164

160

162    162    162

POR area
(logic)

PCM area
(Memory/AI)

150

RRAM area

1

SELECTIVE DEPOSITION ON METALS USING POROUS LOW-K MATERIALS

BACKGROUND

The present invention relates generally to semiconductor devices, and more specifically, to selective deposition on metals using porous low-k materials for nano-fabrication applications.

The shrinking device dimensions in semiconductor manufacturing call for new innovative processing approaches. Conventionally, patterning in semiconductor processing involves subtractive processes, in which blanket layers are deposited, masked by photolithographic techniques, and etched through openings in the mask. Additive patterning is also known, in which masking steps precede deposition of the materials of interest, such as patterning using lift-off techniques or damascene processing. In most cases, expensive multi-step lithographic techniques are applied for patterning.

Patterning could be simplified by selective deposition, which has gained increasing interest among semiconductor manufacturers. Selective deposition would be highly beneficial in various ways. Selective deposition could allow a decrease in lithography steps, thus reducing the cost of processing. Selective deposition could also enable enhanced scaling in narrow structures, such as by making bottom up fill possible. Electrochemical deposition is one form of selective deposition, as metals can be formed selectively on conductive elements. Chemical vapor deposition (CVD) and atomic layer deposition (ALD) are surface-sensitive vapor deposition techniques, and, therefore, have been investigated as good candidates for selective deposition.

One of the challenges with selective deposition is selectivity for deposition processes is often not high enough to accomplish the goals of selectivity. Surface pretreatment is sometimes available to either inhibit or encourage deposition on one or both of the surfaces, but often such treatments themselves call for lithography to have the treatments applied or remain only on the surface to be treated.

Moreover, the use of copper (Cu) metal in multilayer metallization schemes for manufacturing integrated circuits has created several issues. For example, high mobility of Cu atoms in dielectric materials and silicon (Si) can result in migration of Cu atoms into those materials, thereby forming electrical defects that can destroy an integrated circuit. Thus, Cu metal layers, Cu filled trenches, and Cu filled vias are normally encapsulated with a barrier layer to prevent Cu atoms from diffusing into the dielectric materials. Barrier layers are normally deposited on trench and via sidewalls and bottoms prior to Cu deposition, and may include materials that are preferably non-reactive and immiscible in Cu, provide good adhesion to the dielectrics materials and can offer low electrical resistivity.

The electrical current density in an integrated circuit's interconnects significantly increases for each successive technology node due to decreasing minimum feature sizes. Because electromigration (EM) and stress migration (SM) lifetimes are inversely proportional to current density, EM and SM have fast become important challenges. EM lifetime in Cu dual damascene interconnect structures is strongly dependent on atomic Cu transport at the interfaces of bulk Cu metal and surrounding materials which is directly correlated to adhesion at these interfaces. New materials that provide better adhesion and better EM lifetime have been studied. For example, a cobalt-tungsten-phosphorus (CoWP) or CVD Co layer has been selectively deposited on bulk Cu metal using an electroless plating technique. The interface of CoWP or Co and bulk Cu metal has superior adhesion strength that yields longer EM lifetime. However, maintaining acceptable deposition of thick Co or CoWP selectivity on bulk Cu metal, especially for tight pitch (<24 nm) Cu wiring, and maintaining good film uniformity, has adversely affected the acceptance of this complex process. Furthermore, wet process steps using acidic solution may be detrimental to the use of CoWP and Co.

Accordingly, a need exists for more practical processes for accomplishing selective deposition.

SUMMARY

In accordance with an embodiment, a method is provided for selective deposition on metals using porous low-k materials. The method includes forming alternating layers of a porous dielectric material and a first conductive material, forming a surface aligned monolayer (SAM) over the first conductive material, depositing hydroxamic acid (HA) material over the porous dielectric material, growing an oxide material over the first conductive material, removing the SAM, depositing a dielectric layer adjacent the oxide material, and replacing the oxide material with a second conductive material defining a bottom electrode.

In accordance with another embodiment, a method is provided for selective deposition on metals using porous low-k materials. The method includes forming alternating layers of a porous dielectric material and a first conductive material, forming a surface aligned monolayer (SAM) over the first conductive material, depositing hydroxamic acid (HA) material over the porous dielectric material, applying irradiation to one or more of the first conductive materials to produce SAM HA cross-linking, growing an oxide material over the first conductive material including only the SAM, removing the SAM, depositing a dielectric layer adjacent the oxide material, and replacing the oxide material with a second conductive material defining a bottom electrode.

In accordance with yet another embodiment, a method is provided for selective deposition on metals using porous low-k materials. The method includes employing a carbon rich dielectric to enable a selective deposition process using either an atomic layer deposition (ALD) or chemical vapor deposition (CVD) process where the carbon rich dielectric inhibits ALD growth and using a pre-patterned film including metal and carbon rich dielectric where the ALD or CVD process leads to film formation only on a metal surface.

In accordance with another embodiment, a semiconductor device is provided for selective deposition on metals using porous low-k materials. The semiconductor device includes alternating layers of a porous dielectric material and a first conductive material, a surface aligned monolayer (SAM) disposed over the first conductive material, hydroxamic acid (HA) material disposed over the porous dielectric material, and an oxide material grown over the first conductive material including only the SAM. The HA material produces a film on the porous dielectric material that prevents thermal atomic layer deposition (ALD) or chemical vapor deposition (CVD) processes.

In accordance with yet another embodiment, a semiconductor device is provided for selective deposition on metals using porous low-k materials. The semiconductor device includes alternating layers of a porous dielectric material and a first conductive material, a surface aligned monolayer (SAM) disposed over the first conductive material, hydroxamic acid (HA) material disposed over the porous dielectric material, SAM HA cross-linking regions produced by applying irradiation to one or more of the first conductive materials, and an oxide material grown over the first conductive material. The HA material produces a film on the porous dielectric material that prevents thermal atomic layer deposition (ALD) or chemical vapor deposition (CVD) processes.

In one preferred aspect, the oxide material includes zinc oxide (ZnO).

In another preferred aspect, the oxide material includes aluminum oxide (AlOx).

In another preferred aspect, the oxide material is grown over the first conductive material at a temperature of about 150° C.

In yet another preferred aspect, the bottom electrode is tantalum nitride (TaN).

In yet another preferred aspect, the HA material extends into pores of the porous dielectric material.

In yet another preferred aspect, the HA material produces a film on the porous dielectric material that prevents thermal atomic layer deposition (ALD) or chemical vapor deposition (CVD) processes.

In yet another preferred aspect, the HA material has a carbon-rich composition exhibiting inhibitory properties.

In yet another preferred aspect, the oxide material is deposited in a Magnetic Random Access Memory (MRAM), a Resistive Random Access Memory (RRAM) or Phase Change Memory (PCM) area of a chip.

In yet another preferred aspect, the irradiation is applied by e-beam exposure or by extreme ultraviolet (EUV) exposure.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
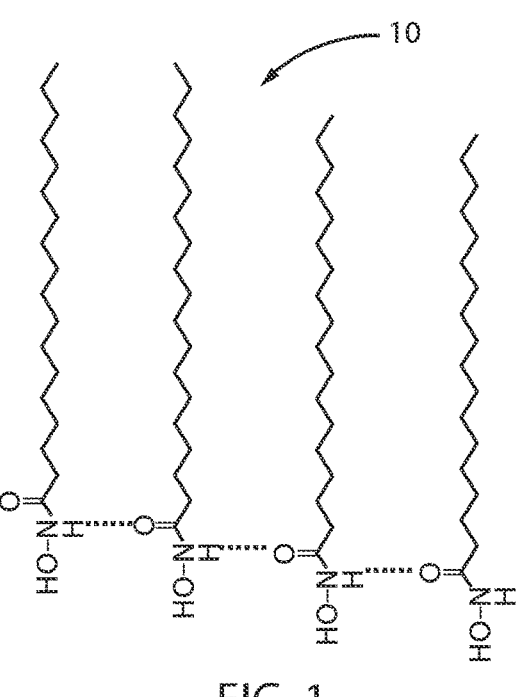
FIG. 1 illustrates hydrogen bonding in surface aligned molecules or monolayers (SAM) hydroxamic acid (HA), in accordance with an embodiment of the present invention.

Embodiments in accordance with the present invention provide methods and devices for selective deposition on metals by advantageously using porous low-k materials for nano-fabrication applications. This is accomplished by advantageously using a carbon rich dielectric (such as SiCOH or SiCN or SiCNO) with preferred carbon concentration>20 atomic % to enable a selective deposition process using either an atomic layer deposition (ALD) or chemical vapor deposition (CVD) process where the carbon rich dielectric inhibits ALD growth and by using a pre-patterned film including metal and carbon rich dielectric where the ALD or CVD process leads to film formation only on the metal surface. The metal surface is advantageously functionalized with a hydroxamic acid (HA) organic inhibitor and subsequent pattern-wise exposure (using either electron beam lithography or extreme ultraviolet lithography) of the hydroxamic acid (HA) to ensure deposition in a subsequent ALD/CVD process occurs only on the unexposed region of the hydroxamic acid surface. Moreover, the metal surface is advantageously functionalized with a hydroxamic acid (HA) organic inhibitor such that beneficial use of this structure is enabled in an ALD or CVD process to selectively deposit a dielectric material both on the pre-patterned dielectric and the unexposed metal surface. If the dielectric is a carbon rich film, a pre-treatment using a reducing plasma chemistry is needed to activate the surface for ALD or CVD deposition. This surface treatment is needed before surface functionalization of the metal with the hydroxamic acid.

Embodiments in accordance with the present invention further provide methods and devices for an area selective process advantageously enabled by a carbon rich interlayer dielectric where nucleation and growth by a number of organometallic precursors (e.g., Zn, Al, Ti) is limited because of a low concentration of surface reactive groups (e.g., —OH groups). In addition, carbon rich surfaces have been shown to inhibit film growth from a CVD process such as polymeric materials even though they may include heteroatoms or reactive hydroxyl groups. The advantageous utilization of carbon rich films, as described herein, can inhibit film growth. Further advantages and benefits include the use of an organic material and porous dielectric to enable the selective deposition on metal, the selective deposition of liner materials for back-end-of-the-line (BEOL) processing or to cap metals and prevent oxidation in downstream processing, selective deposition of a metal oxide or metal nitride without a lithographic process step to reduce alignment errors in a final build, and the use of hydroxamic acid films that offer the benefit to pattern in a desired region with a development step being the selective growth of a material in a desired area.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 illustrates hydrogen bonding in surface aligned molecules or monolayers (SAM) hydroxamic acid (HA), in accordance with an embodiment of the present invention.

The chemical structure 10 of SAM HA is illustrated in FIG. 1.

As utilized herein, "self-assembled monolayer" or "surface aligned monolayer" ("SAM") generally refers to a layer of molecules that are attached (e.g., by a chemical bond) to a surface and that have adopted a preferred orientation with respect to that surface and even with respect to each other. The SAM usually includes an organized layer of amphiphilic molecules in which one end of the molecule, the "head group" shows a specific, reversible affinity for a substrate. Selection of the head group will depend on the application of the SAM, with the type of SAM compounds based on the substrate utilized. Generally, the head group is connected to an alkyl chain or fluorinated alkyl chain in which a tail or "terminal end" can be functionalized, for example, to vary wetting and interfacial properties. The molecules that form the SAM will selectively attach to one material over another material (e.g., metal vs. dielectric) and if of sufficient density, can successfully operate subsequent deposition allowing for selective deposition on materials not coated with the SAM, etc.

Examples of suitable SAM molecules which can be utilized in accordance with the implementations described herein include the materials described hereinafter, including combinations, mixtures, and grafts thereof, in addition to other SAM molecules having characteristics suitable for blocking deposition of subsequently deposited materials in a semiconductor fabrication process. In one implementation, the SAM molecules 14 can be carboxylic acid materials, such as methylcarboxylic acids, ethycarboxylic acids, propylcarboxylic acids, butylcarboxylic acids, pentylcarboxylic acids, hexylcarboxylic acids, heptylcarboxylic acids, octylcarboxylic acids, nonylcarboxylic acids, decylcarboxylic acids, undecylcarboxylic acids, dodecylcarboxylic acids, tridecylcarboxylic acids, tetradecylcarboxylic acids, pentadecylcarboxylic acids, hexadecylcarboxylic acids, heptadecylcarboxylic acids, octadecylcarboxylic acids, and nonadecylcarboxylic acids.

In one implementation, the SAM molecules can be hydroxamic acid materials, such as suberoyl anilide hydroxamic acids, cinnamyl hydroxamic acid, sulfonamide hydroxamic acids, succinimide hydroxamic acids, pyrimidine-derived hydroxamic acids, heterocyclic-amide hydroxamic acids, and cyclic hydroxamic acids.

In one implementation, the SAM molecules can be phosphonic acid materials, such as methylphosphonic acid, ethylphosphonic acid, propylphosphonic acid, butylphosphonic acid, pentylphosphonic acid, hexylphosphonic acid, heptylphosphonic acid, octylphosphonic acid, nonylphosphonic acid, decylphosphonic acid, undecylphosphonic acid, dodecylphosphonic acid, tridecylphosphonic acid, tetradecyphosphonic acid, pentadecylphosphonic acid, hexadecylphosphonic acid, heptadecylphosphonic acid, octadecylphosphonic acid, and nonadecylphosphonic acid.

In another implementation, the SAM molecules can be thiol materials, such as methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, and nonadecanethiol.

In another implementation, the SAM molecules can be silylamine materials, such as tris(dimethylamino)methylsilane, tris(dimethylamino)ethylsilane, tris(dimethylamino)propylsilane, tris(dimethylamino)butylsilane, tris(dimethylamino)pentylsilane, tris(dimethylamino)hexylsilane, tris(dimethylamino)heptylsilane, tris(dimethylamino)octylsilane, tris(dimethylamino)nonylsilane, tris(dimethylamino)decylsilane, tris(dimethylamino)undecylsilane tris(dimethylamino)dodecylsilane, tris(dimethylamino)tridecylsilane, tris(dimethylamino)tetradecylsilane, tris(dimethylamino)pentadecylsilane, tris(dimethylamino)hexadecylsilane, tris(dimethylamino)heptadecylsilane, tris(dimethylamino)octadecylsilane, and tris(dimethylamino)nonadecylsilane.

In another implementation, the SAM molecules can be chlorosilane materials, such as methyltrichlorosilane, ethyltrichlorosilane, propyltrichlorosilane, butyltrichlorosilane, pentyltrichlorosilane, hexyltrichlorosilane, heptyltrichlorosilane, octyltrichlorosilane, nonyltrichlorosilane, decyltrichlorosilane, undecyltrichlorosilane, dodecyltrichlorosilane, tridecyltrichlorosilane, tetradecyltrichlorosilane, pentadecyltrichlorosilane, hexadecyltrichlorosilane, heptadecyltrichlorosilane, octadecyltrichlorosilane, and nonadecyltrichlorosilane.

In another embodiment, the SAM molecules can be oxysilane materials, such as methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, heptyltrimethoxysilane, heptyltriethoxysilane, octyltrimethoxysilane, octyltriethoxysilane, nonyltrimethoxysilane, nonyltriethoxysilane, decyltrimethoxysilane, decyltriethoxysilane, undecyltrimethoxysilane, undecyltrethoxysilane, dodecyltrimethoxysilane, dodecyltriethoxysilane, tridecyltrimethoxysilane, tridecyltriethoxysilane, tetradecyltrimethoxysilane, tetradecyltriethoxysilane, pentadecyltrimethoxysilane, pentadecyltriethoxysilane, hexadecyltrimethoxysilane, hexadecyltroethoxysilane, heptadecyltrimethoxysilane, heptadecyltriethoxysilane, octadecyltrimethoxylsilane octadecyltriethoxysilane, nonadecyltrimethoxysilane, and nonadecyltriethoxysilane.

In another implementation, the SAM molecules can have a fluorinated R group, such as (1,1,2,2-perfluorodecyl) trichlorosilane, trichloro(1,1,2,2-perfluorooctyl)silane, (trideca-fluoro-1,1,2,2-tetrahydrooctyl)trichlorosilane, (tride-cafluoro-1,1,2,2-tetrahydro-octyl)triethoxysilane, (tridecafluoro-1,1,2,2-tetrahydrooctyl)methyldichlorosilane, (tridecafluoro-1,1,2,2-tetrahydrooctyl)dimethylchlorosilane, and (heptadecafluoro-1,1,2,2-tetrahydrodecyl)trichlorosilane, among others.

A hydroxamic acid (HA) is a class of organic compounds bearing the functional group RC(O)N(OH)R', with R and R' as organic residues and CO as a carbonyl group. Hydroxamic acids are amides (RC(O)NHR') wherein the NH center has an OH substitution.

Hydroxamic acids constitute the largest class of Histone deacetyiase (HDAC) inhibitors.

Figure 2:
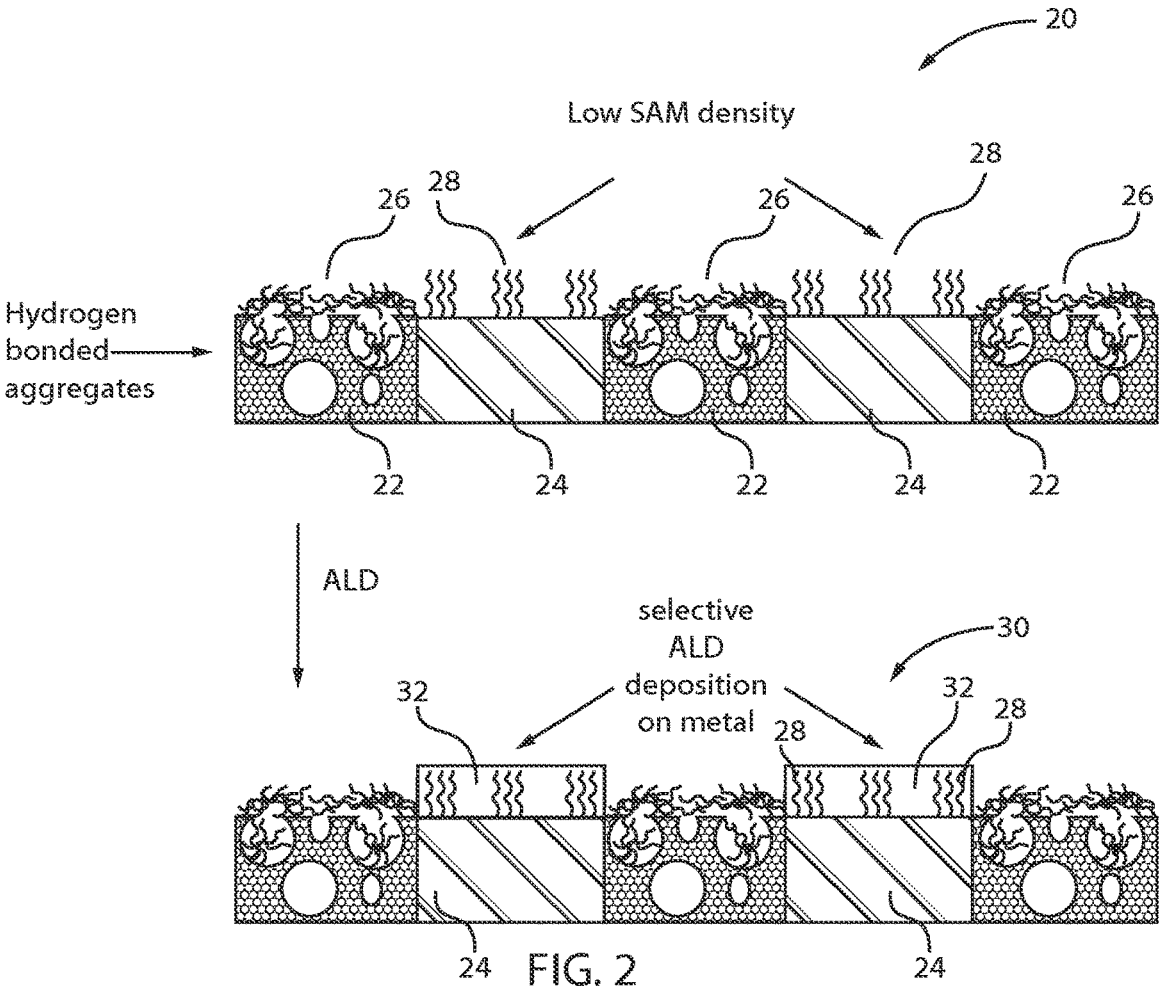
FIG. 2 is a semiconductor structure including a plurality of alternating porous dielectric and conductive regions, where SAM is formed over the conductive regions and HA is formed over the porous dielectric regions, and where selective atomic layer deposition (ALD) deposition occurs over the conductive regions, in accordance with an embodiment of the present invention.

FIG. 2 is a semiconductor structure including a plurality of alternating porous dielectric and conductive regions, where SAM is formed over the conductive regions and HA is formed over the porous dielectric regions, and where selective atomic layer deposition (ALD) deposition occurs over the conductive regions, in accordance with an embodiment of the present invention.

Structure 20 illustrates a substrate having alternating regions of a conductive material 24 and a porous dielectric material 22.

The conductive material 24 can be, e.g., copper (Cu).

The porous dielectric material 22 can be, e.g., an inter-layer dielectric (ILD).

In a non-limiting example, the ILD 22 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials. In one example, the ILD 22 can be a low-k oxide.

Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The conductive metal can be deposited by a suitable deposition process, for example, CVD, PECVD, PVD, plating, thermal or e-beam evaporation, and sputtering.

HA 26 is advantageously deposited over the porous dielectric material regions 22 and SAM 28 is formed over the conductive material regions 24. The HA 26 advantageously produces a film on the porous dielectric material regions 22 effective at blocking deposition from a thermal ALD or CVD process.

Structure 30 illustrates the selective ALD/CVD deposition on the conductive material regions 24. The deposition of an oxide layer 32 over the SAM 28 formed over the conductive material regions 24 is thus enabled.

The oxide layer 32 can be, e.g., zinc oxide (ZnO) or aluminum oxide (AlOx).

The HA 26 can extend into the pores of the porous dielectric material regions 22.

Figure 3:
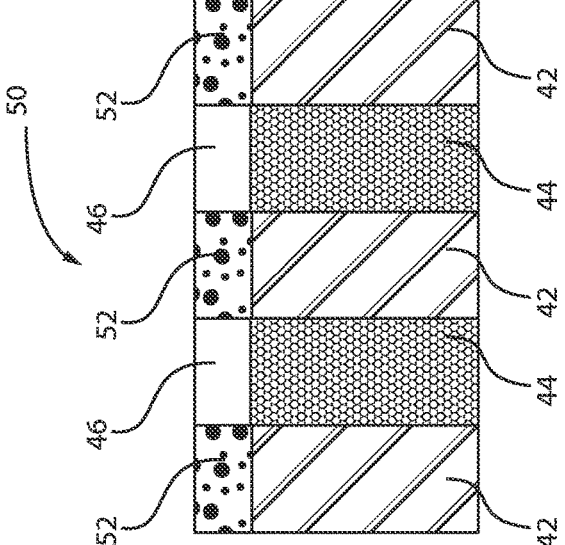
FIG. 3 illustrates selective deposition on metal in back-end-of-the-line (BEOL) processing, in accordance with an embodiment of the present invention.
Figure 3:
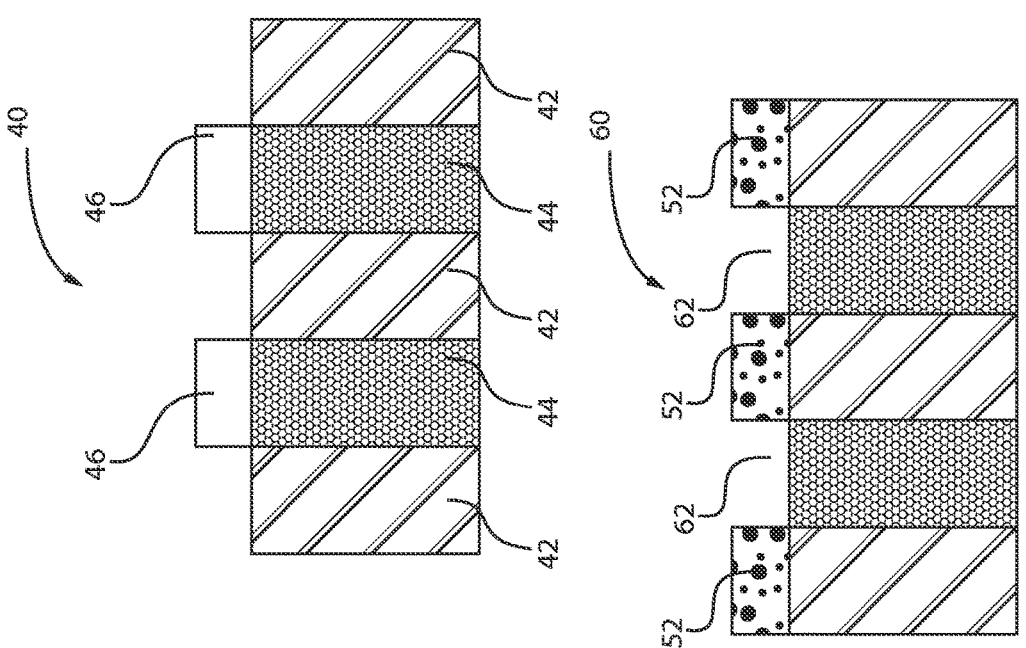

FIG. 3 illustrates selective deposition on metal in back-end-of-the-line (BEOL) processing, in accordance with an embodiment of the present invention.

Structure 40 illustrates a substrate having alternating regions of a conductive material 44 and a dielectric material 42.

The conductive material 44 can be, e.g., copper (Cu).

The dielectric material 42 can be, e.g., a ultra-low-k dielectric.

The ultra-low-k (ULK) material can be, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

Oxide regions 46 are formed over the conductive material 44. The oxide regions can be, e.g., ZnO regions 46.

Structure 50 illustrates deposition of another low-k-dielectric 52 over the existing dielectric material 42. The low-k dielectric 52 can be deposited by, e.g., furnace chemical vapor deposition (FCVD). The low-k dielectric 52 can be reduced by chemical-mechanical polishing (CMP) and/or etching.

Structure 60 illustrates the oxide regions 46 being selectively removed to create opening 62 over the conductive material 44. Removal of the oxide regions 46 is selective to the low-k dielectric 52 with, e.g., a wet etch, such as, but not limited to, acetic acid, Dihydrofolic acid (DHF), and hydrogen peroxide.

This dielectric-on-dielectric process with ZnO (grown at 150° C., polycrystalline) as a high thermal stability, sacrificial material, advantageously enables dielectric deposition at high temperature, thereby leading to lower capacitance. In contrast, conventional systems and methods are limited to a temperature of less than 80° C. for dielectric-on-dielectric selective deposition.

Figure 4:
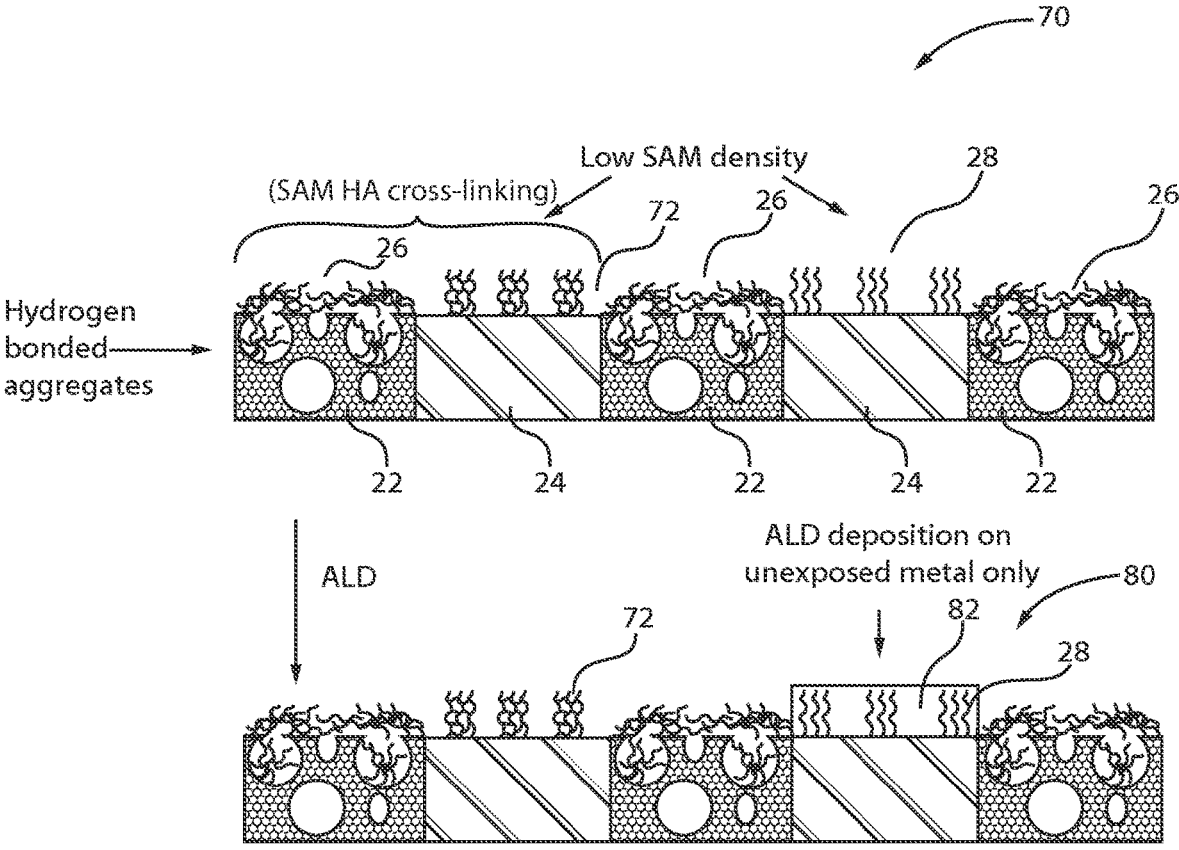
FIG. 4 illustrates is a semiconductor structure including a plurality of alternating porous dielectric and conductive regions, where irradiation takes place to enable SAM HA cross-linking, in accordance with another embodiment of the present invention.

FIG. 4 illustrates is a semiconductor structure including a plurality of alternating porous dielectric and conductive regions, where irradiation takes place to enable SAM HA cross-linking, in accordance with another embodiment of the present invention.

In an alternative embodiment, irradiation is used to tailor the inhibition region.

Similarly to FIG. 2, structure 70 illustrates a substrate having alternating regions of a conductive material 24 and a porous dielectric material 22.

The conductive material 24 can be, e.g., copper (Cu).

The porous dielectric material 22 can be, e.g., an inter-layer dielectric (ILD).

HA 26 is advantageously deposited over the porous dielectric material regions 22 and SAM 28 is formed over the conductive material regions 24. However, due to irradiation, SAM HA cross-linking advantageously occurs such that SAM HA cross-links 72 occur over a conductive material region 24. The irradiation can accomplished by, e.g., e-beam exposure or extreme ultraviolet (EUV) exposure. The HA 26 advantageously produces a film on the porous dielectric material regions 22 effective at blocking deposition from a thermal ALD or CVD process.

Structure 80 illustrates the selective ALD/CVD deposition on the conductive material regions 24. The deposition of an oxide layer 82 over the SAM 28 formed over a conductive material region 24 is thus advantageously enabled, where irradiation has not occurred. Thus, irradiation can be employed to advantageously tailor the inhibition region. In other words, a designer can select which conductive material regions include the inhibitor.

The oxide layer 82 can be, e.g., zinc oxide (ZnO).

The HA 26 can extend into the pores of the porous dielectric material regions 22.

Figures 5, 6:
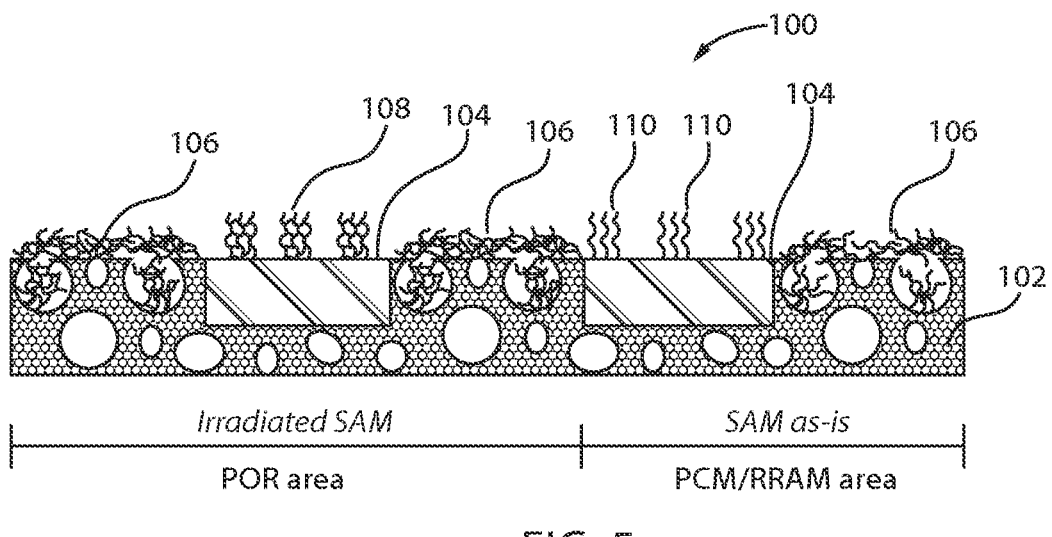
FIG. 5 is a cross-sectional view of a semiconductor structure where SAM is deposited and SAM irradiation occurs in the POR area, in accordance with an embodiment of the present invention.
FIG. 6 is a cross-sectional view of the semiconductor structure of FIG. 5 where a dielectric growth occurs over a conductive region in the PCM/RRAM area, in accordance with an embodiment of the present invention.

FIG. 5 is a cross-sectional view of a semiconductor structure where SAM is deposited and SAM irradiation occurs in the POR area, in accordance with an embodiment of the present invention.

In another example, structure 100 illustrates conductive material regions 104 formed within a porous dielectric material 102. HA 106 is advantageously deposited over the exposed porous dielectric material portions and SAM 110 is formed over one or more of the conductive material regions 104. SAM HA cross-links 108 are also advantageously formed over one or more of the conductive material regions 108. In particular, in the POR area (logic area), where the SAM has been irradiated, SAM HA cross-links 108 are formed, whereas in the phase change memory/resistive random access memory (PCM/RRAM) area (memory area), where the SAM has not been irradiated, SAM 110 is formed.

FIG. 6 is a cross-sectional view of the semiconductor structure of FIG. 5 where a dielectric growth occurs over a conductive region in the PCM/RRAM area, in accordance with an embodiment of the present invention.

A dielectric growth 115 occurs over a conductive material region 104 in the PCM/RRAM area. As noted above, the dielectric growth 115 can be, e.g., ZnO. The dielectric growth can be formed via ALD or CVD.

Figures 7, 8:
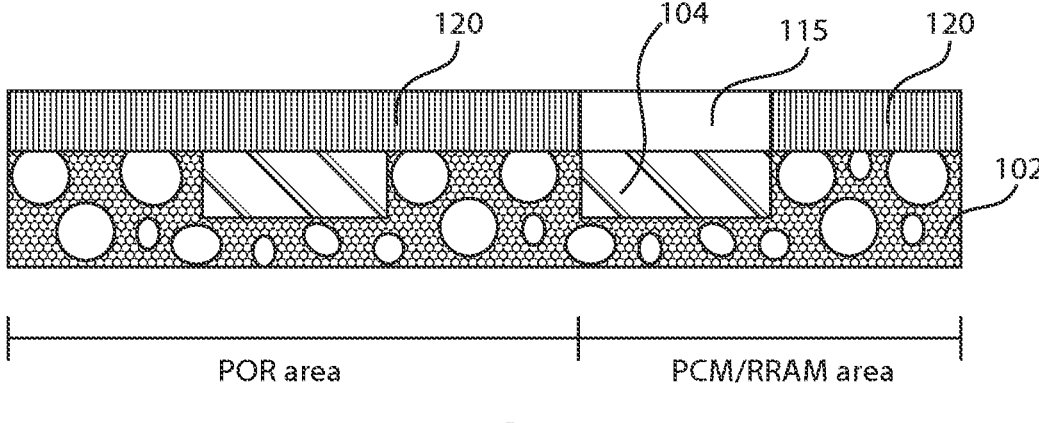
FIG. 7 is a cross-sectional view of the semiconductor structure of FIG. 6 where the SAM is removed and dielectric deposition takes place, in accordance with an embodiment of the present invention.
FIG. 8 is a cross-sectional view of the semiconductor structure of FIG. 7 where the dielectric growth is removed and replaced with a metal electrode, in accordance with an embodiment of the present invention.

FIG. 7 is a cross-sectional view of the semiconductor structure of FIG. 6 where the SAM is removed and dielectric deposition takes place, in accordance with an embodiment of the present invention.

After deposition of the dielectric growth 115, the SAM 110 is removed and a dielectric deposition takes place. For example, a SiN or a SiCN layer 120 is deposited and planarized via, e.g., CMP. Thus, the dielectric layer 120 can be a nitride, for example, a silicon nitride (SiN), an oxynitride, for example, silicon oxynitride (SiON), or a combination thereof. In a preferred embodiment, the dielectric layer 120 can be silicon nitride (SiN), for example, $Si_3N_4$.

FIG. 8 is a cross-sectional view of the semiconductor structure of FIG. 7 where the dielectric growth is removed and replaced with a metal electrode, in accordance with an embodiment of the present invention.

The dielectric growth 115 is removed by, e.g., wet etch, and replaced with a metal electrode 125. The metal electrode 125 can be, e.g., TaN. The metal electrode 125 is self-aligned to the conductive material region 104.

The metal electrode 125 can be referred to as a bottom electrode. The bottom electrode 125 exists on metal lines in RRAM cross-bar array regions only.

In other embodiments, the bottom electrode 125 can include a conductive material, such as Cu, Al, Ag, Au, Pt, Co, W, etc. In some embodiments, the bottom electrode 125 can include nitrides such as TiN, TaN, Ta or Ru.

Figure 9:
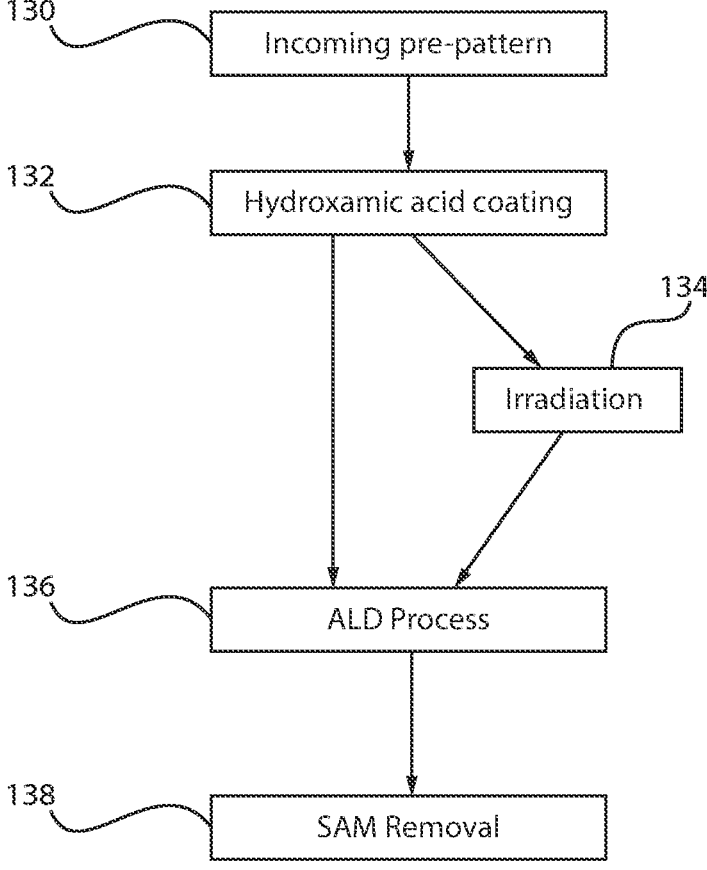
FIG. 9 is a block/flow diagram of a method for selective deposition on metals using porous low-k materials, in accordance with an embodiment of the present invention.

FIG. 9 is a block/flow diagram of a method for selective deposition on metals using porous low-k materials, in accordance with an embodiment of the present invention.

At block 130, pre-patterning takes place where the alternating layers of dielectric material and conductive material are formed.

At block 132, a hydroxamic acid coating layer is advantageously deposited.

At block 134, irradiation takes place. Irradiation can occur via e-beam exposure or via EUV exposure. In one example, the e-beam dose can be, e.g., 5000 uC/cm$^2$.

At block 136, an ALD process is commenced where ZnO growth occurs. In one instance, a $(C_2H_5)_2$Zn-water process, with 700 cycles at a temperature of about 150° C. is performed.

At block 138, the SAM can be optionally removed.

Figure 10:
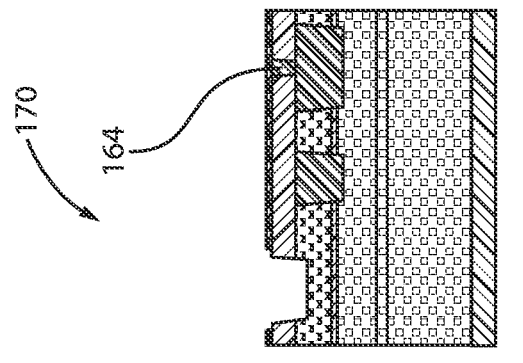
FIG. 10 is a practical application for selective deposition on metals using porous low-k materials, in accordance with an embodiment of the present invention.
Figure 10:
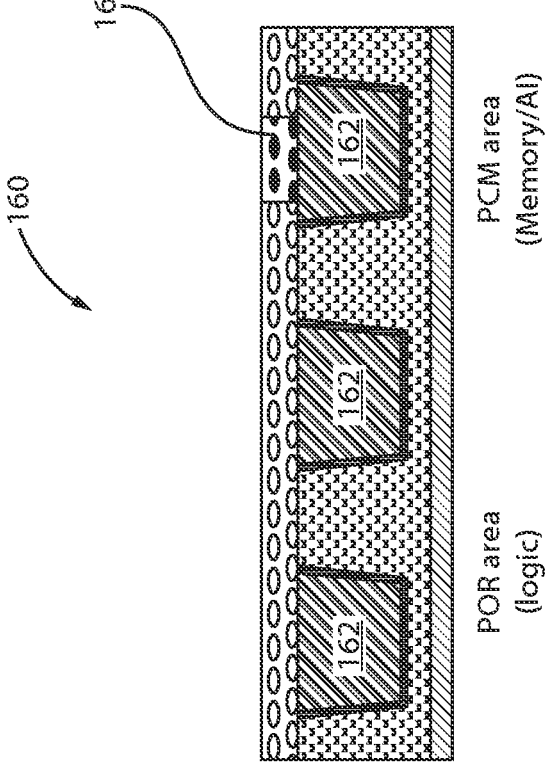
Figure 10:
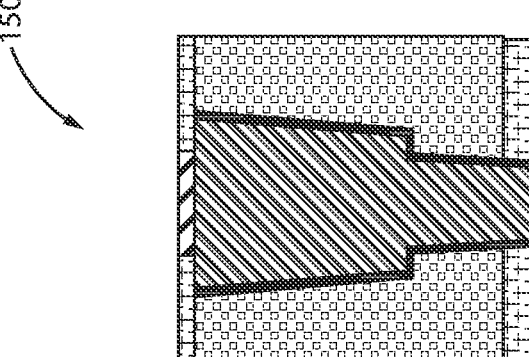

FIG. 10 is a practical application for selective deposition on metals using porous low-k materials, in accordance with an embodiment of the present invention.

Structure 150 illustrates a RRAM area with a conductive line.

Structure 160 illustrates a plurality of conductive liens 162 formed within a dielectric. A bottom electrode 164 is formed over one of the conductive lines 162. The bottom electrode 164 can be, e.g., TaN. This is equivalent to the configuration shown in FIG. 8.

Structure 170 illustrates the bottom electrode 164 in an MRAM configuration.

The metal lines 162 can be any conductive materials known in the art, such as, for example, copper (Cu), cobalt (Co), aluminum (Al), platinum (Pt), gold (Au), tungsten (W), titanium (Ti), or any combination thereof. The metal lines 162 can be fabricated using any technique known in the art, such as, for example, a single or dual damascene technique. In an embodiment, not illustrated, the metal lines 162 can be copper (Cu) and can include a metal liner, where a metal liner can be metals, such as, for example, tantalum nitride and tantalum (TaN/Ta), titanium, titanium nitride, cobalt, ruthenium, and manganese or a combination of these. The metals 162 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 162 can be reduced by chemical-mechanical polishing (CMP) and/or etching. Therefore, the planarization process can be provided by CMP. Other planarization process can include grinding and polishing.

In conclusion, the exemplary embodiments of the present invention employ a combination of a pre-pattern surface including a metal and dielectric with open porosity with a hydroxamic acid (HA) that advantageously produces a film on dielectric effective at blocking deposition from a thermal ALD or CVD process. The process described is used to deposit a low-k material on a dielectric surface in a fully-aligned via process. The process described is further used to selectively deposit a sacrificial metal oxide on a metal pre-pattern for advantageous use in the fabrication of Magnetic Random Access Memory (MRAM), Resistive Random Access Memory (RRAM) or Phase Change Memory (PCM). In the exemplary process, a metal oxide or nitride is selectively deposited on the metal portion of a prepatterned surface composed of co-planar metal and dielectric features. The advantageous use of a novel SAM aliphatic hydroxamic acid (SAM HA) to produce a thicker film on a porous dielectric surface (e.g., p SiCOH with 2-50% porosity range, 5-25% range preferred) is introduced.

The exemplary embodiments of the present invention further employ a metal/porous dielectric pre-patterned surface, enable solution deposition of a Hydroxamic Acid (HA) material (incoming pre-pattern immersed in solution and rinsed), where a high density (thick film) is obtained on the porous low-k dielectric, and the HA material is deposited on the metal surface but at a lower density than on the porous low-k dielectric. The contrast in thickness between the two surfaces advantageously leads to less inhibition on the metal. In another exemplary embodiment, optional cross-linking of the SAM HA is advantageously enabled through irradiation as an enhancer of the inhibiting window. After 700 cycles of a metal oxide ALD process, metal oxide selectively grows, such that growth exists only on metal in unexposed regions and there is no film observed in the irradiated regions. Optionally, the SAM layer is removed. Thus, the exemplary embodiments do not require a surface treatment to inhibit deposition as the exemplary embodiments advantageously employ a carbon-rich dielectric composition (HA material) that exhibits inhibitory properties (from metals including precursors such as diethyl zinc). Also, a molecular layer deposition process is not required to selectively grow an inhibiting layer.

Regarding the structural figures, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Deposition is any process that grows, coats, or otherwise transfers a dielectrics material (e.g., SiCOH, SiOx) onto the wafer are included. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

UV cure is the main processing process method for improving the SAM crossing-linking and the SiCOH dielectrics. As options, other treatments such as thermal cure, E-Beam, microwave cure, etc. can be implemented to achieve the same result.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

The dry and wet etching processes employed in the exemplary embodiments can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a Hydro-gen-based chemistry. Hydrogen is the main etchant in this case with various plasma. Other dry etchant gasses can include Ammonia ($NH_3$), Oxygen ($O_2$), Carbon Dioxide ($CO_2$), Nitrous Oxide ($N_2O$), or more reactive Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as deep reactive-ion etching (DRIE). Chemical vapor etching can be used as a selective etching method, and the etching gas can include, Hydrogen ($H_2$), Ammonia ($NH_3$), Oxygen ($O_2$), Carbon Dioxide ($CO_2$), Nitrous Oxide ($N_2O$), or hydrogen chloride (HCl), $CF_4$, and gas mixture with hydrogen ($H_2$). Chemical vapor etching can be performed by CVD with suitable pressure and temperature.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for selective deposition on metals using porous low-k materials for nano-fabrication applications (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method comprising:
forming alternating layers of a porous dielectric material and a first conductive material;
patterning the alternating layers of the porous dielectric material and the first conductive material;
depositing hydroxamic acid (HA) material over the alternating layers of the porous dielectric material and the first conductive material, the HA material forming a surface aligned monolayer (SAM) over the first conductive layer;
selectively growing an oxide material over the SAM on the first conductive material;
depositing a dielectric layer adjacent the oxide material;
removing the SAM and the oxide material; and
depositing a second conductive material on the first conductive material defining a bottom electrode.

2. The method of claim 1, wherein the oxide material includes zinc oxide (ZnO) or aluminum oxide (AlOx).

3. The method of claim 2, wherein the oxide material is grown over the first conductive material at a temperature of about 150° C.

4. The method of claim 1, wherein the bottom electrode is tantalum nitride (TaN).

5. The method of claim 1, wherein the HA material extends into pores of the porous dielectric material.

6. The method of claim 1, wherein the HA material produces a film on the porous dielectric material that prevents thermal atomic layer deposition (ALD) or chemical vapor deposition (CVD) processes.

7. The method of claim 1, wherein the HA material has a carbon-rich composition exhibiting inhibitory properties.

8. The method of claim 1, wherein the oxide material is deposited in a Magnetic Random Access Memory (MRAM), a Resistive Random Access Memory (RRAM) or Phase Change Memory (PCM) area of a chip.

9. A method comprising:
forming alternating layers of a porous dielectric material and a first conductive material;
patterning the alternating layers of the porous dielectric material and the first conductive material;
depositing hydroxamic acid (HA) material over the alternating layers of the porous dielectric material and the first conductive material, the HA material deposited over the first conductive material forming a surface aligned monolayer (SAM);

applying irradiation to one or more portions of the first conductive material to produce SAM HA cross-linking;

selectively growing an oxide material over the SAM on the first conductive material including a non-irradiated portion of the SAM;

depositing a dielectric layer adjacent the oxide material;

removing the non-irradiated portion of the SAM and the oxide material; and depositing a second conductive material on the first conductive material defining a bottom electrode.

10. The method of claim 9, wherein the oxide material includes zinc oxide (ZnO) or aluminum oxide (AlOx).

11. The method of claim 10, wherein the oxide material is grown over the first conductive material at a temperature of about 150° C.

12. The method of claim 9, wherein the bottom electrode is tantalum nitride (TaN).

13. The method of claim 9, wherein the HA material extends into pores of the porous dielectric material.

14. The method of claim 9, wherein the HA material produces a film on the porous dielectric material that prevents thermal atomic layer deposition (ALD) or chemical vapor deposition (CVD) processes.

15. The method of claim 9, wherein the HA material has a carbon-rich composition exhibiting inhibitory properties.

16. The method of claim 9, wherein the oxide material is deposited in a Magnetic Random Access Memory (MRAM), a Resistive Random Access Memory (RRAM) or Phase Change Memory (PCM) area of a chip.

17. The method of claim 9, wherein the irradiation is applied by e-beam exposure.

18. The method of claim 9, wherein the irradiation is applied by extreme ultraviolet (EUV) exposure.

\* \* \* \* \*